US009070436B2

(12) United States Patent
Ordentlich et al.

(10) Patent No.: US 9,070,436 B2
(45) Date of Patent: Jun. 30, 2015

(54) MEMORY CONTROLLER USING CRISSCROSS ERROR-CORRECTING CODES

(71) Applicant: Hewlett-Packard Development Company, L.P., Houston, TX (US)

(72) Inventors: Erik Ordentlich, San Jose, CA (US); Ron M. Roth, Haifa (IL); Gadiel Seroussi, Cupertino, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 241 days.

(21) Appl. No.: 13/754,842

(22) Filed: Jan. 30, 2013

(65) Prior Publication Data

US 2014/0215121 A1 Jul. 31, 2014

(51) Int. Cl.
*G06F 12/02* (2006.01)
*G11C 16/00* (2006.01)
*G11C 7/10* (2006.01)
*G11C 13/00* (2006.01)
*G11C 17/16* (2006.01)

(52) U.S. Cl.
CPC ............ *G11C 16/00* (2013.01); *G06F 12/0246* (2013.01); *G11C 7/1006* (2013.01); *G11C 13/0007* (2013.01); *G11C 17/165* (2013.01); *G11C 2213/77* (2013.01)

(58) Field of Classification Search
None
See application file for complete search history.

(56) References Cited

U.S. PATENT DOCUMENTS

| 6,343,045 | B2 | 1/2002 | Shau |
| 7,206,987 | B2 | 4/2007 | Roth et al. |
| 7,505,337 | B2 | 3/2009 | Nowak et al. |
| 2012/0098566 | A1 | 4/2012 | Robinett |
| 2012/0124449 | A1 | 5/2012 | Mirichigni |
| 2013/0111102 | A1* | 5/2013 | Kim .............................. 711/101 |

FOREIGN PATENT DOCUMENTS

| WO | WO2012002931 A1 | 1/2012 |
| WO | WO2012015401 A1 | 2/2012 |
| WO | WO2012121689 A1 | 9/2012 |

OTHER PUBLICATIONS

Niu, D. et al., "Low Power Memristor-based Reram Design with Error Correcting Code," Design Automation Conference Asia and South Pacific, Jan. 30, 2012-Feb. 2, 2012.
Silva, D. et al., "A Rank-Metric Approach to Error Control in Random Network Coding," IEEE Transactions on Information Theory, Sep. 2008, vol. 54, Issue 9, pp. 3951-3967.
Roth, R.M., "Maximum-Rank Array Codes and their Application to Criss-Cross Error Correction," IEEE Transations on Inforamtion Theory, Mar. 1991, vol. 37, Issue 2, pp. 328-336.

* cited by examiner

*Primary Examiner* — Kevin Verbrugge
(74) *Attorney, Agent, or Firm* — Patent Law Group LLP

(57) ABSTRACT

A method is provided to manage access to a memory array. The method includes encoding a bit string with a rank metric encoder to generate an encoded binary array, modifying the encoded binary array so each row has at most half of the row with a bit value and each column has at most half of the column with the bit value, and storing the modified binary array into corresponding memory devices of the memory array.

20 Claims, 11 Drawing Sheets

MEMORY CONTROLLER USING CRISSCROSS ERROR-CORRECTING CODES

BACKGROUND

Solid state storage systems are attractive because they are rugged and data persistent without power. One type of solid state memory device is based on resistive switching devices that exhibit a memristive behavior. A memristive device can be programmed to be in an "on" state with a low resistance or an "off" state with a high resistance. Such memristive devices may be fabricated in a crossbar with a high cell density. In a memristive crossbar, there are multiple memristive devices on each column or row wire. To program or read the value of a memristive device, a corresponding write or read voltage is applied to that device through the column and the row wires of the selected memristive device.

BRIEF DESCRIPTION OF THE DRAWINGS

In the drawings.

Use of the same reference numbers in different figures indicates similar or identical elements.

DETAILED DESCRIPTION

Figure 1:
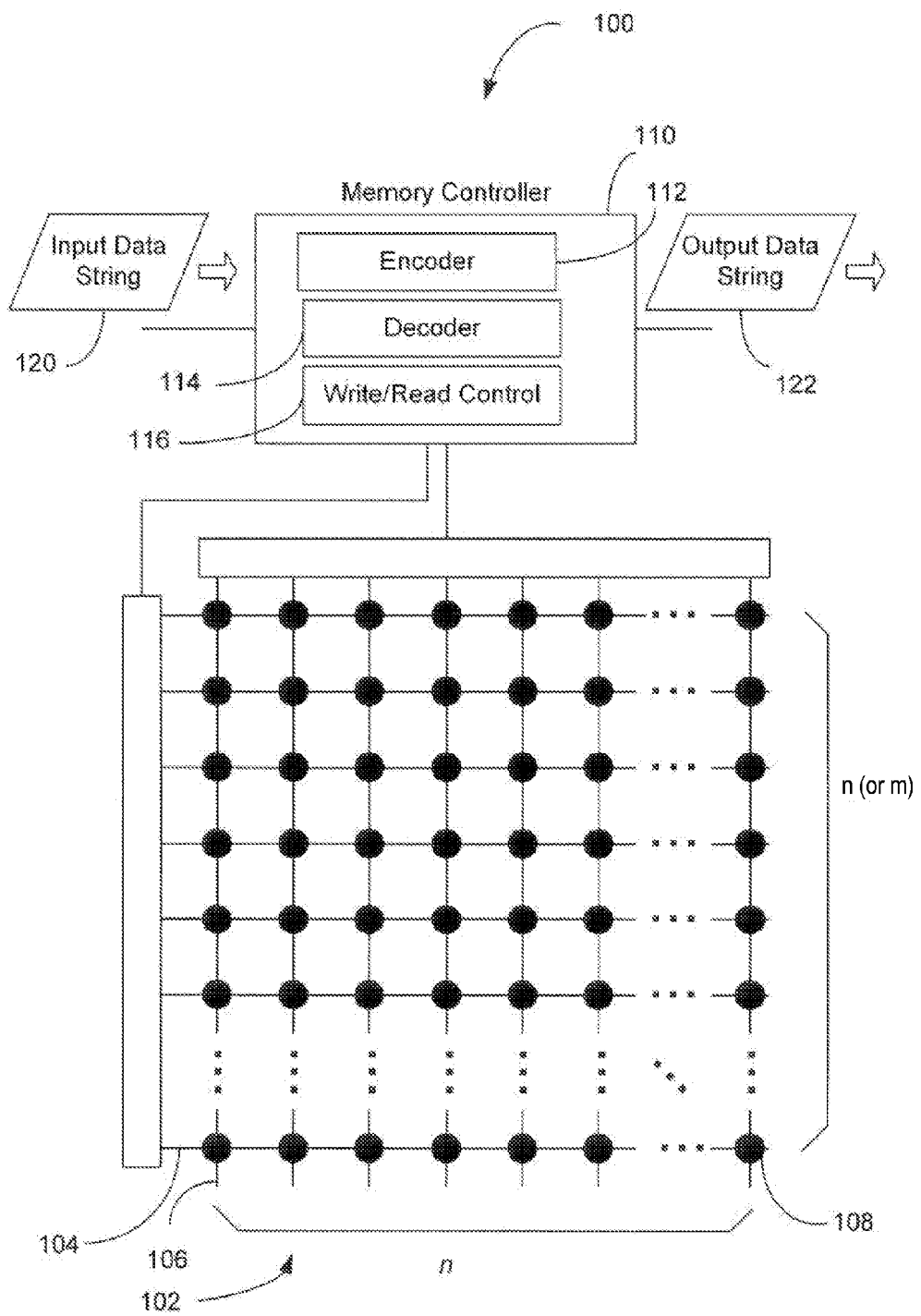
FIG. 1 is a block diagram of an apparatus in one example of the present disclosure.

In a memristive crossbar, defective (e.g., shorted) memristive devices may be present at manufacture or emerge during operation. A shorted memristive device has an even lower resistance than the on (or low resistance) state used for storing data. A shorted memristive device is difficult to revive since it may not be possible to apply a large voltage across the terminals of the shorted memristive device to increase its resistance and alter its state. As memristive devices in the same row and the same column are directly connected, a shorted memristive device may induce read and write errors to the data stored in the other memristive devices in the same row and the same column.

Too many memristive devices in the on (or low resistance) state in a row or a column may be detrimental to a memristive crossbar. To read or write a memristive device, a read or write voltage is applied to the row and the column wires connected to selected memristive device. The other memristive devices connected to the same row wire and the same column wire are "half-selected" because they also experience voltage drops across their terminals. An excess of the half-selected memristive devices in the on (or low resistance) state may result in a high current passing through portions of the corresponding horizontal and vertical wires during read and write operations and cause leakage currents that contribute to the noise floor during reads.

Examples of the present disclosure are provided to recover from defective (e.g., shorted) memory devices and reduce leakage currents in a memory array such as a memristive crossbar. A crisscross error-correcting code, such as a rank metric code, may encode a bit string into a codeword that is an encoded binary array. Leakage current from storing the codeword in the memory array may be mitigated by bit flipping entire rows and columns in the codeword until they correspond to having at most half of the memory devices in each row and column written to the on (low resistance) state. Bit flipping refers to an iterative process where each row having more than half of its bits in the ON state is flipped (inverted) in its entirety, each column having more than half of its bits in the ON state is flipped, and repeating the row flipping followed by column flipping until no row and no column has more than half of its bits in the ON state. The net effect of the flipping corresponds to perturbing the codeword with a rank two error. Defective (e.g., shorted) memory devices in the memory array may affect the access of other memory devices in the same rows and the same columns, resulting in additional rank two errors on top of the flipping. When a corrupted codeword is read from the memory array, the crisscross error-correcting code may reverse the effects from the flipping and the defective memory devices.

In one example of the present disclosure, a rank metric code encodes and decodes length $n^2-\rho$ strings of unconstrained bits to and from n by n binary arrays in which the number of bits in the low resistance state is no more than half in each row and each column, where n is a dimension of the binary array and $\rho$ is the redundancy of the code. The rank metric code may correctly decode the binary array in the presence of s crisscross erasures and t crisscross errors provided that $2+2s+4t<\delta$, where $\delta$ is the minimum rank distance of the code, $s \geq 0$, and $t \geq 0$. A crisscross erasure corresponds to erasing a row and a column (i.e., replacing with erasure symbols). A crisscross error corresponds to flipping any number of bits in a row and a column. In the event that a row and a column are in error and the decoder knows the indices of the row and the column, they can be treated as a crisscross erasure for decoding purposes. Given s and t satisfy $2+2s+4t<\delta$, the following analysis shows that a rank metric code decoder is able to recover the original codeword after any sequence of single row and column flips, after corruption by at most s crisscross erasures, and after corruption by at most t crisscross errors.

Given $\rho$ and n, a rank metric code encodes $n^2-\rho$ strings of bits into n by n binary arrays with the property that for any pair of binary arrays $A_1$ and $A_2$ that correspond to encoded data, the difference matrix $D=A_1-A_2$ ($=A_1+A_2$) computed modulo 2 has a rank of at least $\delta$.

Property 2.1 (Minimum rank distance of $\delta$) This latter condition, in particular, means, that D cannot be expressed as:

$$\sum_{i=1}^{\delta'} u_i v_i^T$$

for $\delta'<\delta$, where $u_i$ and $v_i$ are binary vectors of length n and all operations are modulo 2.

Let $i_1, i_2, \ldots, i_s$ be the indices of the erased rows and $j_1, j_2, \ldots, j_s$ be the indices of the erased columns corresponding to the s crisscross erasures. Correct decoding may be possible in all cases of the indicated scenario if, for any binary array corrupted by row/column flipping, crisscross erasures, and crisscross errors, there is a unique encoded binary array that could lead to it. Suppose, by way of contradiction, that there existed a corrupted binary array B that could be obtained under the above row/column flipping, crisscross erasures, and crisscross errors from two valid encoded binary arrays $A_1$ and $A_2$. Let B' be obtained from B by filling in all erased positions with 0's. Then B' is expressed as:

$$B' = A_1 + u_0 1^T + 1 v_0^T + \sum_{p=1}^{s}\left(u_p e_{j_p}^T + e_{i_p} v_p^T\right) + \sum_{p=s+1}^{s+2t} u_p v_p^T$$

and as $$B' = A_2 + \tilde{u}_0 1^T + 1 \tilde{v}_0^T + \sum_{p=1}^{s}\left(\tilde{u}_p e_{j_p}^T + e_{i_p} \tilde{v}_p^T\right) + \sum_{p=s+1}^{s+2t} \tilde{u}_p \tilde{v}_p^T$$

where $1=(1, 1, \ldots, 1)^T$ denotes the all 1's column vector, $e_k$ denotes the column vector consisting of all 0's except for a 1 in row k, and all operations are modulo 2. The above two expressions for B' can be subtracted modulo 2 to yield:

$$A_1 - A_2 = (u_0 - \tilde{u}_0)1^T + 1(v_0 - \tilde{v}_0)^T + \sum_{p=1}^{s}\left((u_p - \tilde{u}_p)e_{j_p}^T + e_{i_p}(v_p - \tilde{v}_p)^T\right) + \sum_{p=s+1}^{s+2t} u_p v_p^T - \sum_{p=s+1}^{s+2t} \tilde{u}_p \tilde{v}_p^T$$

or that $D=A_1-A_2$ can be expressed as a linear combination of $2+2s+4t<\delta$ rank one matrices contradicting Property 2.1. Thus, if $2+2s+4t<\delta$, then any sequence of row/column flips, up to s crisscross erasures, and up to t crisscross errors may be decoded uniquely and correctly. Note that $\delta$ is greater than 2 even when there are no crisscross erasures or errors expected (i.e., when s and $t=0$) to allow recovery from the row and column bit flips used to limit the number of 1's in each row and column during encoding.

FIG. 1 is a block diagram of an apparatus 100 in one example of the present disclosure. Apparatus 100 includes an n by n memory array 102 with multiple memory devices 108, where n is an integer. Memory devices 108 are resistive switching devices capable of switching to an ON state of low resistance and an OFF state of high resistance. As used herein, an "n by n memory array" means that there are a first set of n conductors and a second set of n conductors in the memory array, and each of the n conductors in the first set intersects each of the n conductors in the second set once to address a memory device located at that intersection. For ease of reference, in the description below the conductors in the first set will be referred to as "row conductors" and the conductors in the second set will be referred to as "column conductors." It should be noted, however, that the terms "row" and "column" are used herein in this context mainly as labels and do not impose any particular limitations on the physical layout of the conductors in the memory array.

A simple example of an n by n array is a crossbar that has n row wire segments 104 and n column wire segments 106 in one circuit plane. The row wire segments 104 run in one direction and intersect with the column wire segments 106 that run in another direction, with a total of $n^2$ memory devices formed at the intersections of the row and column wires segments. The crossbar shown in FIG. 1 is only an example of an n by n memory array, and there are many different ways to form such an array. For instance, the conductors and memory devices do not have to be all in the same circuit plane, and the conductors do not have to be straight wire segments and do not have to form a rectangular grid. By way of example, a 128 by 256 array may be formed by combining two 128 by 128 crossbars on two circuit planes. To that end, each row wire segment of the crossbar in the first plane may be connected by a via to a corresponding row wire segment of the crossbar in the second plane. In that case, the two connected row wire segments and the connection via together form one "row conductor," while each column wire segment in either plane is a "column conductor" of the 128 by 256 memory array.

To control the operations of storing and retrieving data to and from memory array 102, apparatus 100 includes a memory controller 110. The memory controller 110 has modules for various functions, including an encoder module 112 for data encoding, a decoding module 114 for data decoding, and a write/read control module 116 for controlling the operations of writing data to memory array 102 and reading data from memory array 102. As described in greater detail below, memory controller 110 is programmed to encode a bit string 120 received as input, and to store an encoded binary array into memory array 102. The memory controller 110 is also programmed to read out a corrupted binary array from memory array 102, decode the corrupted binary array to recover bit string 120, and transmit bit string 120 as output 122 to another component.

Figure 2:
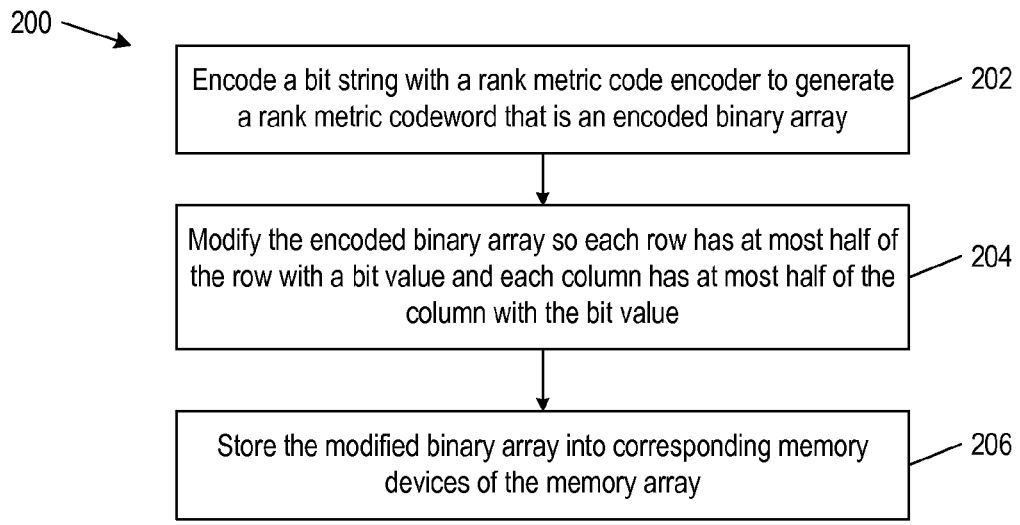
FIG. 2 is a flowchart of a method for a memory controller of FIG. 1 to manage access to a memory array of FIG. 1 in one example of the present disclosure.

FIG. 2 is a flowchart of a method 200 for memory controller 110 (FIG. 1) to manage access to memory array 102 (FIG. 1) in one example of the present disclosure. Method 200 may begin in block 202.

In block 202, memory controller 110 encodes bit string 120 (FIG. 1) with a rank metric code encoder 112 (FIG. 1) to generate a rank metric codeword that is an encoded binary array. Block 202 may be followed by block 204.

In block 204, memory controller 110 modifies the encoded binary array so each row has at most half of the row with a certain bit value (e.g., a bit value of 1) and each column has at most half of the column with the bit value. Block 204 may be followed by block 206.

In block 206, memory controller 110 stores the modified binary array into corresponding memory devices 108 (FIG. 1) of memory array 102.

Figure 3:
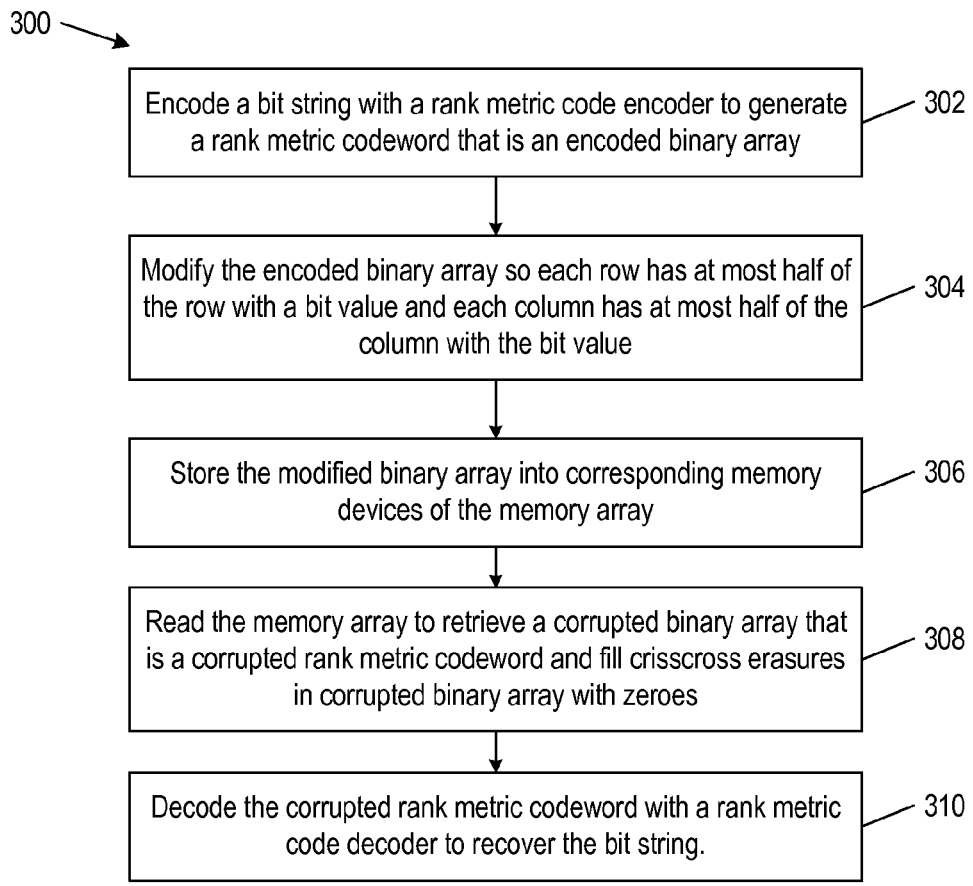
FIG. 3 is a flowchart of another method for the memory controller of FIG. 1 to manage access to the memory array of FIG. 1 in one example of the present disclosure.

FIG. 3 is a flowchart of a method 300 for memory controller 110 (FIG. 1) to manage access (e.g., read and write access) to memory array 102 (FIG. 1) in one example of the present disclosure. Method 300 may begin in block 302.

In block 302, memory controller 110 encodes bit string 120 (FIG. 1) with rank metric code encoder 112 (FIG. 1) to generate a rank metric codeword. In one example, the rank metric code is a maximum-rank-distance (MDR) code such as a Gabidulin code. In one example, the rank metric codeword is an encoded n by n binary array, the rank metric code has a minimum rank distance of $\delta > 2$ and a redundancy $\rho = (\delta - 1)n$ (a property of the Gabidulin codes), and bit string 120 has a length of $n^2 - \rho$. Block 302 may be followed by block 304.

In block 304, memory controller 110 modifies the encoded binary array so each row has at most half of the row with a certain bit value (e.g., a bit value of 1) that corresponds to a low resistance state and each column has at most half of the column with that bit value. In other words, memory controller 110 intentionally introduces recoverable errors to the rank metric codeword in order to reduce leakage current in memory array 102. In one example, memory controller 110 modifies the encoded binary array by iteratively bit-flipping each row having more than half of the row with bit value 1 and each column having more than half of the column with bit value 1 until no such row and column remain. Bit flipping refers to an iterative process where each row having more than half of its bits in the ON state is flipped (inverted) in its entirety, each column having more than half of its bits in the ON state is flipped, and repeating the row flipping followed by column flipping until no row and no column has more than half of its bits in the ON state.

Figure 4:
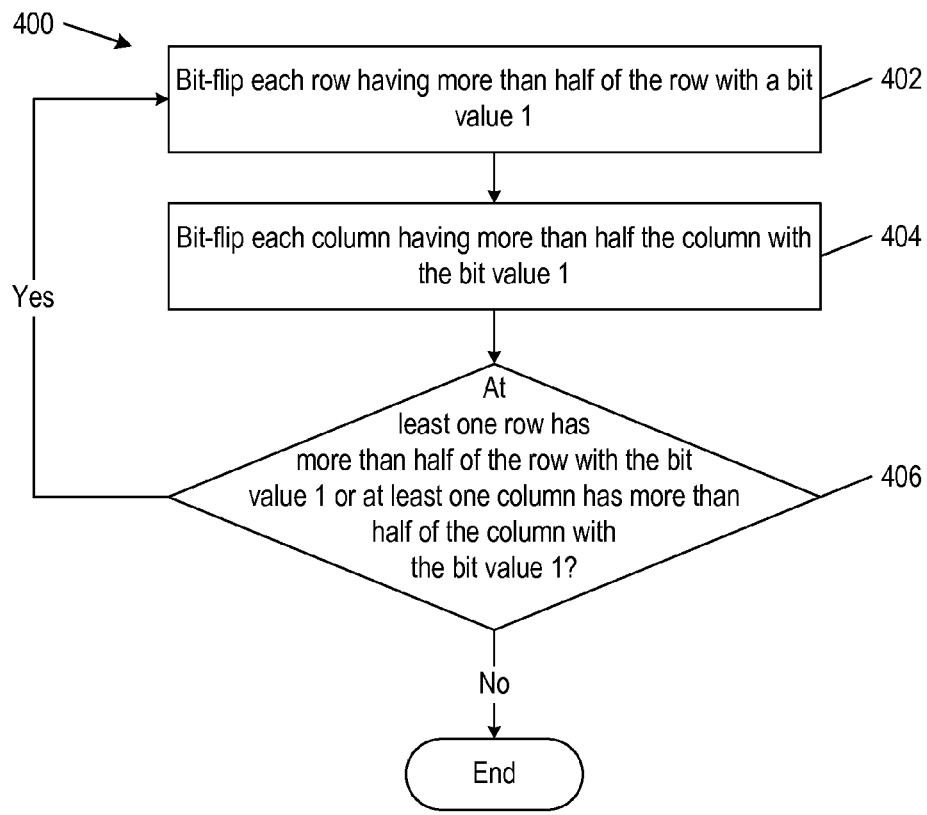
FIG. 4 is a flowchart of a method for the memory controller of FIG. 1 to iteratively bit-flip each row and each column in one example of the present disclosure.

FIG. 4 is a flowchart of a method 400 for memory controller 110 (FIG. 1) to iteratively bit-flip each row and column in one example of the present disclosure. Method 400 may begin in block 402.

In block 402, memory controller 110 bit-flips each row having more than half of the row with a bit value (e.g., a bit value of 1) that corresponds to the low resistance state. Block 402 may be followed by block 404.

In block 404, memory controller 110 bit-flips each column having more than half the column with bit value 1. Block 404 may be followed by block 406.

In block 406, memory controller 110 determines if at least one row has more than half of the row with bit value 1 or at least one column has more than half of the column with bit value 1. If so, block 406 may be followed by block 402. Otherwise method 400 may end.

Notice that each replacement row and each replacement column created in blocks 402 and 404 have n/2 or fewer 1's since the Hamming weights of these replacements and originals add up to n. Moreover, the iterative process is guaranteed to terminate since each replacement row and each replacement column created in blocks 402 and 404 decrease the corresponding number of 1's in the encoded binary array by at least 1 (the number of 1's n the affected row or column decreases from more than n/2 to n/2 or fewer).

Referring back to FIG. 3, block 304 may be followed by block 306.

In block 306, memory controller 110 stores the modified binary array into corresponding memory devices 108 (FIG. 1) of memory array 102. Block 306 may be followed by block 308.

In block 308, memory controller 110 reads memory array 102 to retrieve a corrupted n by n binary array that is a corrupted rank metric codeword. In one example, the corrupted binary array includes s number of crisscross erasures corresponding to corrupted rows and columns having known locations in memory array 102. Memory controller 110 fills the s number of crisscross erasures in the corrupted binary array with a certain bit value (e.g., filling them with 0's). In one example, the corrupted binary array also includes at most t number of crisscross errors that correspond to corrupted rows and columns with unknown locations in memory array 102.

Figure 5:
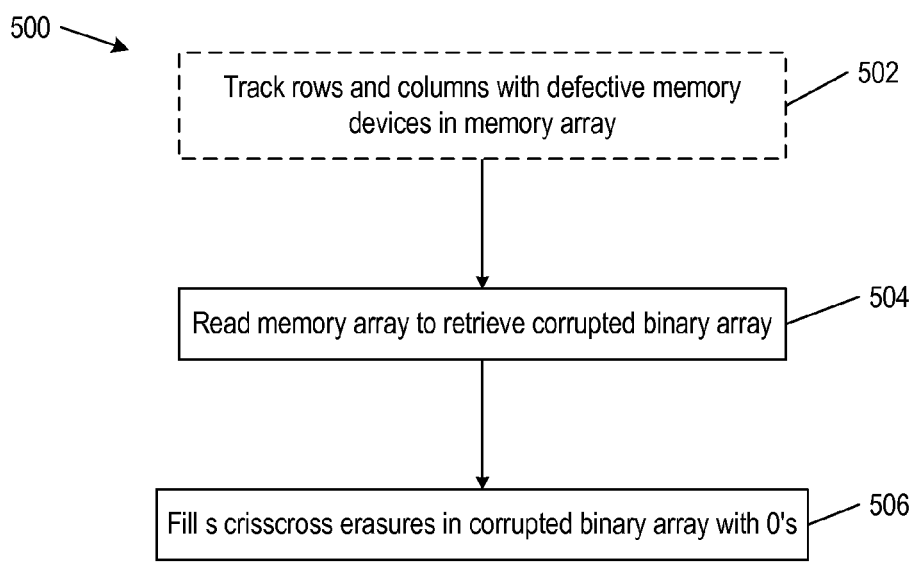
FIG. 5 is a flowchart of a method for the memory controller of FIG. 1 to read the memory array of FIG. 1 in one example of the present disclosure.

FIG. 5 is a flowchart of a method 500 for memory controller 110 (FIG. 1) to read memory array 102 (FIG. 1) in one example of the present disclosure. Method 500 may begin in optional block 502.

In optional block 502, memory controller 110 may track rows and columns with defective (e.g., shorted) memory devices in memory array 102 in a defect list. Memory controller 110 may detect a defective memory device when it tries to write to the defective memory device and the current exceeds a pre-established threshold. Memory controller 110 then records the row and the column that include the defective memory device as corrupted or erased. Optional block 502 may be followed by block 504.

In block 504, memory controller 110 reads memory array 102 to retrieve the corrupted binary array. The corrupted binary array includes s crisscross erasures corresponding to corrupted/erased rows and columns in memory array 102 known to memory controller 110 from optional block 502. Alternatively memory controller 110 detects the corrupted/erased rows and columns as it reads memory array 102 using inline fuses to mark the defective memory devices, which are described later in detail. Block 504 may be followed by block 506.

In block 506, memory controller 110 fills the s crisscross erasures in the corrupted binary array with 0's.

Referring to FIG. 3, block 308 may be followed by block 310.

In block 310, memory controller 110 decodes corrupted the corrupted binary array with rank metric code decoder 114 (FIG. 1) to recover input bit string 120 as output bit string 122 (FIG. 1). Memory controller 110 decodes the corrupted binary array as follows:

$$w = D(B, S)$$

where w is the output bit string, D represents the rank metric code decoder 114, B is the corrupted binary array, and $$S = \{1, 1^T, e_{i_1}, \ldots, e_{i_s}, e_{j_1}^T, \ldots, e_{j_s}^T\}$$

denotes the set of row and column vectors that decoder D accepts corresponding to error $uv^T$ with specified u or $v^T$.

In one example, decoder D assumes the number of crisscross erasures s and crisscross errors t satisfies $2+2s+4t<\delta$, and that the indices of the erased rows and columns are respectively $i_1, \ldots, i_s$ and $j_1, \ldots, j_s$. As described above, let $e_k$ denote the column vectors of all 0's except a 1 in row k. Note that the effect of row/column flips during encoding correspond to two errors of the form $uv^T$ where in one case $u=1$ and in the other $v^T=1^T$.

Figure 6:
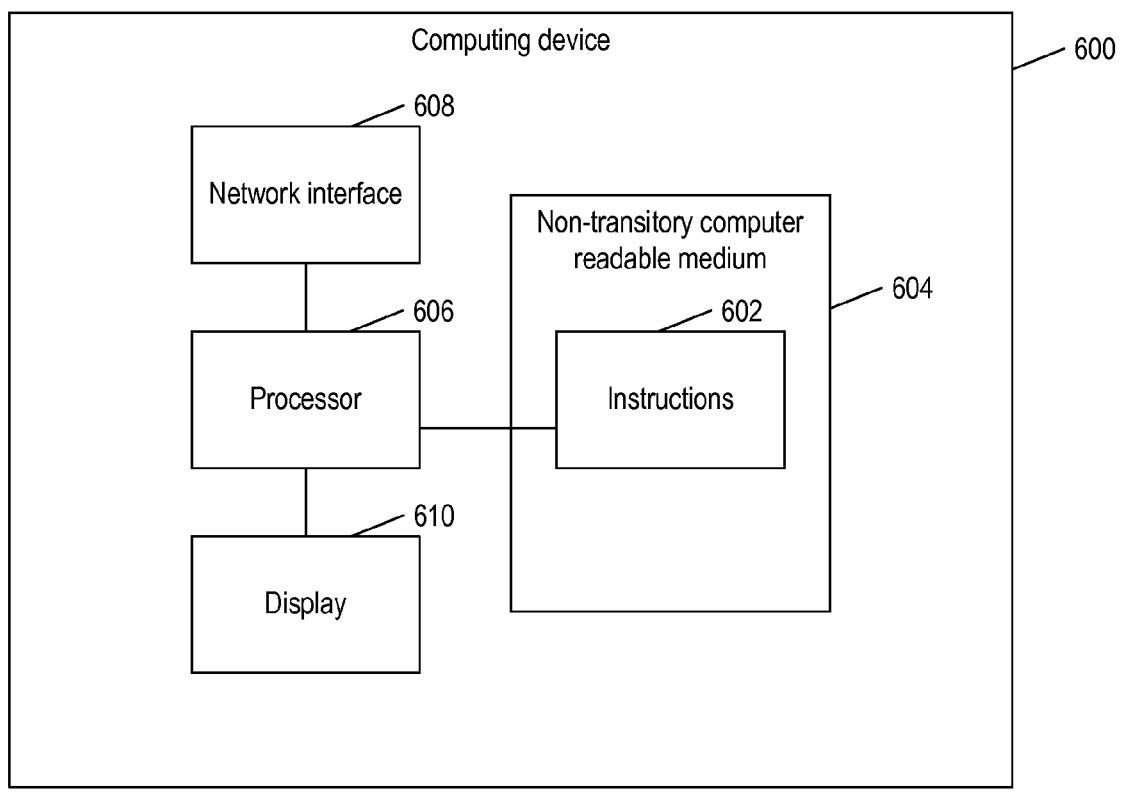
FIG. 6 is a block diagram of a computing device for implementing the memory controller of FIG. 1 in one example of the present disclosure.

FIG. 6 is a block diagram of a computing device 600 for implementing memory controller 110 (FIG. 1) in one example of the present disclosure. Computing device 600 includes processor executable instructions 602 stored in a non-transitory computer readable medium 604, such as hard disk drive, a solid state drive, or another nonvolatile computer memory. A processor 606 executes instructions 602 to provide the described features and functionalities, which may be implemented by sending instructions and data to one or more network interface cards 608 or a display 610.

Although an n by n memory array 102 (FIG. 1) and a rank metric codeword that is an encoded n by n binary array has been described, the present disclosure applies equally well to an m by n memory array and an encoded m by n binary array where m is not equal to n. For an m by n memory array, the expressions for the redundancy and the number of encoded bits become a function of the minimum rank distance for the family of Gabidulin codes. In other words, the redundancy becomes $\rho=(\delta-1)\max(n,m)$ and the number of encoded bits become $nm-\rho$.

Although the rank metric code has been described to correct errors and erasures that occur in a crisscross pattern in a crossbar, they may also be applied to errors and erasures in other configuration. As a crisscross error corresponds to an erroneous row and an erroneous column and has rank 2, the rank metric code may also correct two erroneous columns that correspond to a rank 2 error. More generally, a rank metric code that can correct t crisscross erasures can correct any combination of 2t erroneous rows and columns that may not be equal in number as would arise with crisscross error patterns.

Crossbar arrays of resistive memory elements ("memristors") can be used in a variety of applications, including non-volatile solid state memory, programmable logic, signal processing, control systems, pattern recognition, and other applications. However, failures of the memristors can negatively impact the capacity and performance of the crossbar array. For example, if a memristor shorts, data may be lost and support circuitry damaged.

As used in the specification and appended claims, the term "resistive memory elements" refers broadly to programmable nonvolatile resistors such as resistive random access memory (ReRAM), phase change memory, and memristor technology based on perovskites (such as $Sr(Zr)TiO_3$), transition metal oxides (such as NiO or $TiO_2$), chalcogenides (such as $Ge_2Sb_2Te_5$ or AgInSbTe), solid-state electrolytes (such as GeS, GeSe, $Cu_2S$), organic charge transfer complexes (such as CuTCNQ), organic donor-acceptor systems, various molecular systems, or other nonvolatile programmable resistive memory elements.

Figure 7:
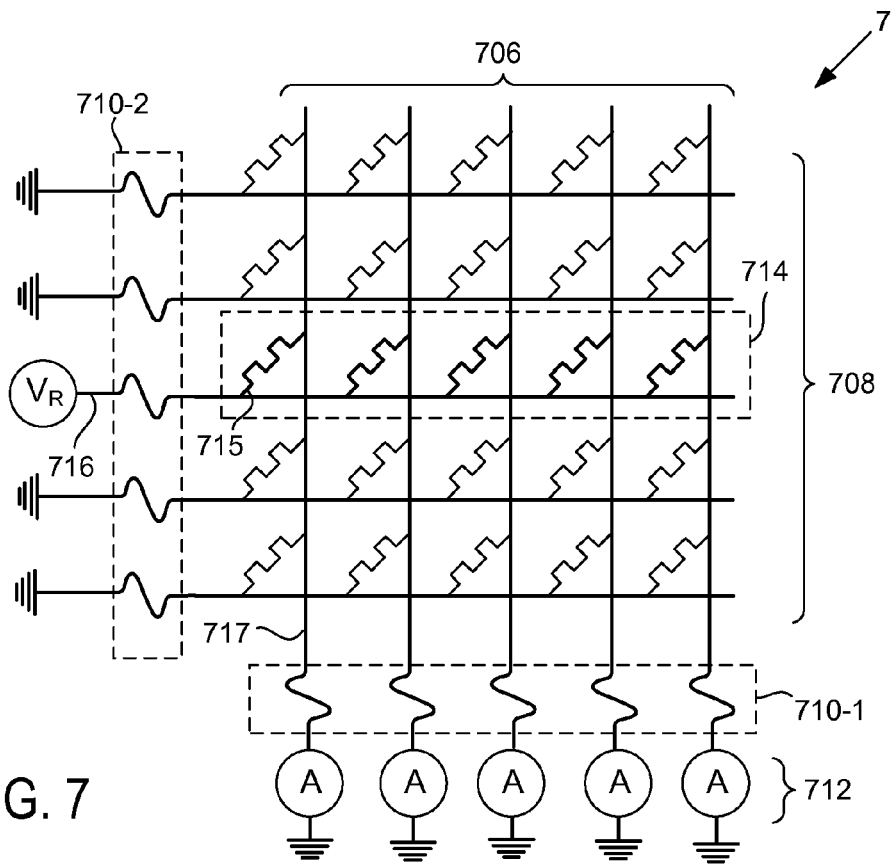
FIG. 7 is a diagram of a read operation of a programmable crossbar array that is populated with memristive or other resistive memory elements at each crossbar junction, according to one example of principles described herein.

FIG. 7 is a diagram of a programmable crossbar array (700). The crossbar array (700) includes a first group of conductive lines (706) called "column lines" and a second group of conductive lines (708) called "row lines." The column lines (706) cross the row lines (708) without actually intersecting each other. The crossings of the column and row lines are called "crossbar junctions." At the crossbar junctions, memristors or other resistive memory elements are formed between the column conductors and the row conductors. For example, memristor (715) has been formed between a column conductor (717) in the first group of lines and a selected row conductor (716) in the second group of lines. For purposes of description, only a small portion of the crossbar array (700) has been illustrated. The crossbar array may include many more conductors, crossbar junctions, and memory devices. In this example, the crossbar is shown as a parallel and perpendicular grid. However, the crossbar array may have a variety of other configurations.

The memristors or other resistive memory elements exhibit a non-volatile resistance value (a "state"). In some examples, the memristors can be used to store data, with the ON or low resistance state representing a digital 1 and an OFF or high resistance state representing a digital 0. In other implementations, the memristors may be multilevel cells that have more than two readable states.

The memristors are programmed by applying a programming voltage (or "write voltage") across a memristor. The application of the programming voltage causes a nonvolatile change in the electrical resistance of the memristor, thereby changing its state. The state of the memristor can be read by applying a read voltage. The read voltage has a lower magnitude than the write voltage and does not disturb the state of the memristor. The state can be determined by reading the amount of a current that passes through the memristor when the read voltage is applied. For example, if a relatively large amount of current flows through the memristor, it can be determined that the memristor is in a low resistance state. If a relatively small amount of current flows through the memristor, it can be determined that the memristor is in a high resistance state.

FIG. 7 shows the electrical configuration of a programmable crossbar array in a read configuration. A read voltage $V_R$ is applied to a row line (716), while the remainder of the row lines is connected to ground. The column lines (706) are also grounded. In this example, there are five memristors (714) connected to the selected row line (716) and the various column lines (706). These five memristors have the read voltage $V_R$ applied across them. Current sensors (712) are placed in each of the column lines to measure the amount of current that passes through each of the selected memristors (714). If a particular memristor is in a high resistance state, the current sensor in the column connected to the memristor will measure a low current. If the memristor is in a low resistance state, a higher current will be measured.

In this example, fuses (710-1, 710-2) are placed in each of the lines. In their unblown state, the fuses have a relatively low electrical resistance and do not interfere with the measurement or programming of the memristors in the array. However, if there is a need to isolate a particular line, the fuse can be blown to disconnect the line from the support circuitry. As shown in FIG. 7, the support circuitry includes voltage sources, current sensors (712), and a ground. The desired support circuitry may be connected with the appropriate line by switches connected to each line in the memristor array.

Figure 8:
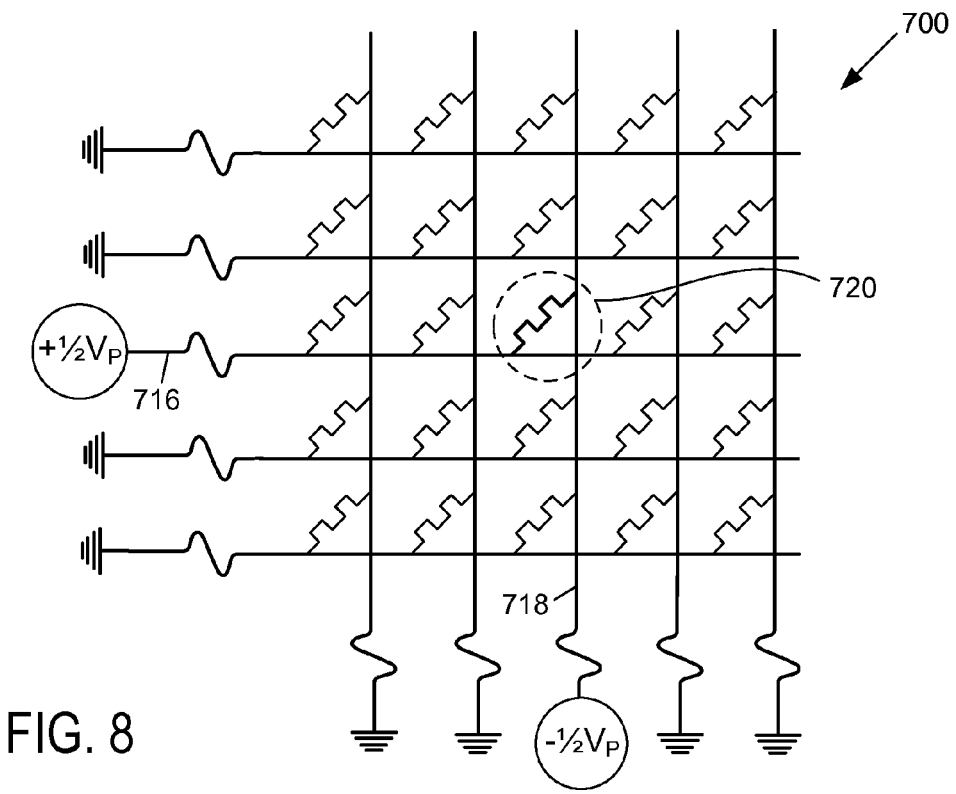
FIG. 8 is a diagram of a write operation within a programmable crossbar array, according to one example of principles described herein.

FIG. 8 shows the same programmable crossbar array (700) in a programming configuration. In this example, a target memristor (720) is being programmed. To program the target memristor, a programming voltage ($V_p$) is applied across the target memristor. In this example, half of the programming voltage ($+½V_p$) is applied to the row line (716) connected to the target memristor (720). The other half of the programming voltage ($-½V_p$) is applied to the column line (718) that is connected to the opposite side of the target memristor. The application of the programming voltage across the target memristor (720) causes a change in the physical properties of the memristor. This alters the resistance state of the memristor. The change in physical properties could result in a higher electrical resistance or a lower electrical resistance, depending on the polarity and/or duration of the applied programming voltage.

The memristor at the intersection between the selected row (716) and column (718) conductors is the selected resistive device (720), while other resistive devices that are connected to only one of the selected row (716) or column (718) crossbars are called "half-selected" devices. The selected device (720) experiences the sum of the two voltages ($V_p$) while the half selected devices experience only half of the programming voltage, which is insufficient to significantly alter their state.

However, the half-selected devices can create "sneak paths" through which current can flow from the selected row conductor (716) to the selected column conductor (718) without passing through the selected device. These sneak currents are not desirable and act as noise that obscures the measurement of the state of the selected device (715). For writing, the sneak paths mean more current needs to be applied to the system, requiring larger transistors to handle the current and larger drivers to provide the current. These larger driving circuits increase the size of the total memory array and architecture, increasing the cost per bit.

Notice that while the programming configuration allows for writing into just one device, in the reading configuration it is possible to read a whole row since current measurements are available simultaneously for all columns. This can result in a significant speed increase during the reading process. For example, a programmable crossbar array may include hundreds or thousands of column lines that can be used simultaneously during a read operation.

Figure 9:
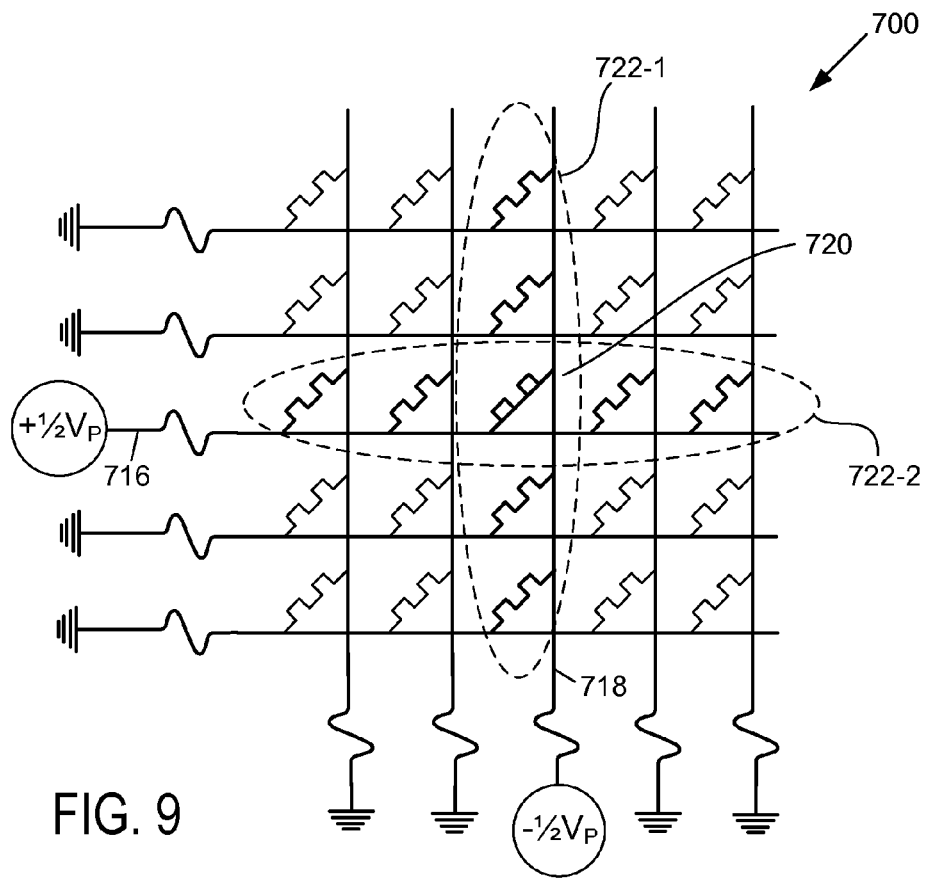
FIG. 9 is a diagram of a programmable crossbar array with a shorted memristor, according to one example of principles described herein.

FIG. 9 shows a programmable crossbar array (700) with a shorted memristor (720). A memristor may short for a variety of reasons, including wear, current spikes, defective manufacturing and other reasons. For example, a memristor that is being programmed from a high resistance state to a low resistance state may experience a surge in current as it transitions from high resistance to low resistance. The electrical characteristics of a shorted memristor are permanently altered so that it remains in a very low resistance state. This shorted state typically has a resistance that is substantially lower than the low resistance ON state of a working memristor. For example, the low resistance state of a working memristor may be on the order of 1 kilo-ohm to 1 mega-ohm. A shorted memristor may have an electrical resistance that is several orders of magnitude lower than this. For example, the shorted memristor may have an electrical resistance that is on the order of 0 ohms to 100 ohms. A shorted memristor cannot be programmed to any other higher resistance state. For example, a shorted memristor may have experienced heating that destroys its memristive matrix and melts the two conductive terminals of the memristor together.

A shorted memristor can degrade the performance of other memristors that share a row or column line with the shorted memristor. In FIG. 9 these "affected" memristors (722-1, 722-2) are circled with dashed lines. When a programming or read voltage is placed on the row and/or column of the shorted memristor, a significant amount of current may flow through the shorted memristor. This creates a leakage path for current and masks the state of the affected memristors. In some situations, it may be possible to read the state of the affected memristors but the affected memristors cannot be reliably written to. If the data can be retrieved from the affected memristors, it can be written to another location in the array or to a different memory.

Further, the presence of a shorted memristor may place significant burdens on support circuitry that is used to supply voltages/currents and measure the currents. For example, a shorted memristor may draw significantly more current from a circuit supplying a read voltage than the circuit is designed to produce. This may damage the circuit and render the entire programmable crossbar array inoperative. Additionally, the current sensing circuit connected to that column may be damaged. Further, the attempts to identify the shorted row/column during reading or writing operations may be unreliable since the short may still exhibit a range of resistance values.

Figure 10:
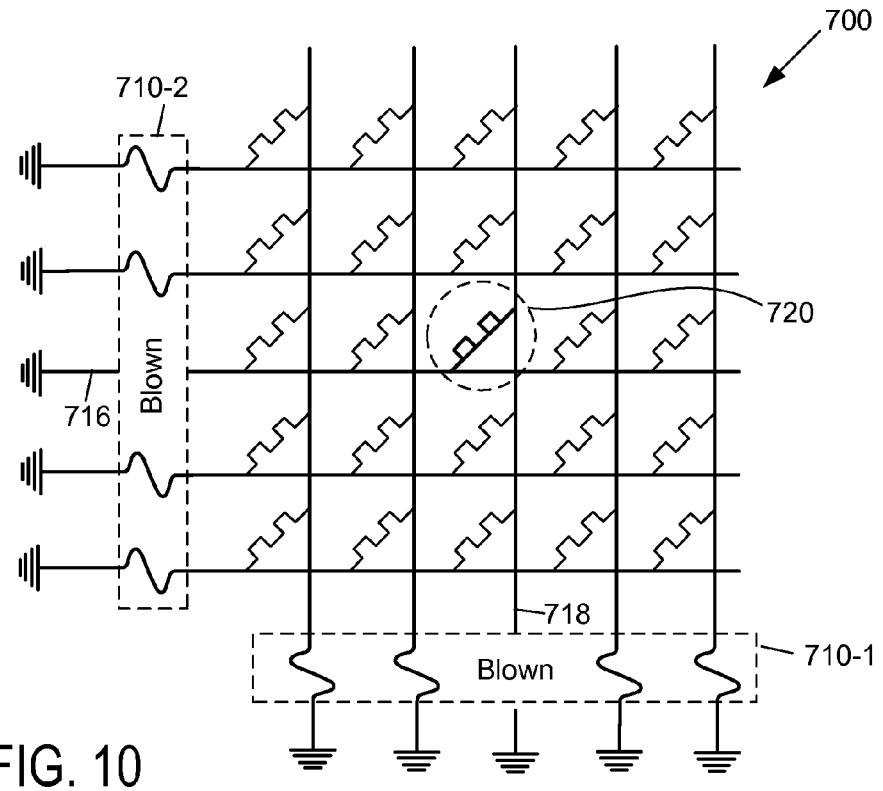
FIG. 10 is a diagram of a programmable crossbar array with blown fuses on the row and column of a shorted memristor, according to one example of principles described herein.

Consequently, it is desirable for there to be a mechanism for isolating the shorted memristor from the support circuitry and to mark the shorted memristor as defective. FIG. 10 shows an example where the inline fuses in the row and column lines connected to the shorted memristor have been blown. The blown fuses disconnect the row and column from the support circuitry and allow the remainder of the circuit to operate as designed. This prevents damage to the support circuitry while maintaining the operation of the remainder of the memristors.

The fuses may be formed in a variety of ways and from a variety of materials. In some examples, the fuses may simply be portions of the column and row lines that have a reduced cross section. These reduced cross section portions of the lines are designed to heat above their melting point when a current indicative of a shorted memristor passes through them. The reduced cross section portions may be designed to melt at current levels that will not damage the support circuitry. In some implementations, the column and row lines may be formed from a conductive metal such as gold, platinum, aluminum, copper or other suitable material.

Other examples of fuses may include separate materials that are interposed between supply circuits and the column/row lines. For example, a polysilicon fuse may be used. A polysilicon fuse is a narrow wire of polysilicon with a non-negligible electrical resistance in its unblown state. For example, a polysilicon fuse with a 0.18 micron width may have a nominal resistance of 20 to 30 ohms When polysilicon fuse is blown it can exhibit an electrical resistance that is 6 to 8 orders of magnitude higher. The principles disclosed herein are not limited to the specific examples described above. The fuse may be any device or mechanism that can disconnect the support circuitry from the row/column lines in response to the shorting of a memristor.

In examples where the fuses are purely resistive in nature, the shorting of the memristor may provide the current needed to blow the appropriate fuse. However, where there are fuses on both the row line and column line that are connected to the memristor, the shorting of the memristor will likely only blow one of the fuses. After the first fuse blows, the current stops and the second fuse will remain intact. In some implementations, this may be sufficient and fuses may only be implemented in row lines or column lines but not both (see e.g. FIGS. 14 and 15 and accompanying descriptions for examples). In other instances it may be desirable to have fuses in both the row and column lines and for both a row fuse and a column fuse to blow when a memristor shorts. As discussed below, this can be accomplished by using external circuitry/mechanisms to identify the second fuse and blow it.

The blowing of the fuses may serve a number of purposes including protection of the support circuitry and more effective recovery on the data in the shorted and/or affected memristors. For example, error correction coding (ECC) schemes are more effective (i.e. require less redundancy) if the presence of the short and the corresponding row/column pair are identified. These identified rows and columns are marked, for purposes of error correction, as "erased." Practical memory systems built of memristor devices are expected to include a very large number of crossbar arrays which could run into the millions or billions. Conceptually, the system could keep a "defect list" of shorted memristors and their locations (row and column). In practice however, the overhead of maintaining and storing such a list may be considered excessive for some applications. Instead, the blown fuses may serve as physical markers of the rows and columns that contain shorted memristors.

After the fuse or fuses are blown the support circuitry is disconnected from the shorted memristor as shown in FIG. 10. As discussed above, this protects the support circuitry, marks the location of the shorted memristor, provides for more reliable reading operations, and allows for more efficient data recovery. However, the disconnected row and column lines may then float in a range of intermediate voltages. For example, the intermediate voltage may be influenced by programming and reading voltages that leak into the disconnected lines. These floating voltages on the disconnected lines may negatively influence the read and write operations for the remainder of the array and introduce variability into the behavior of the array.

Figure 11:
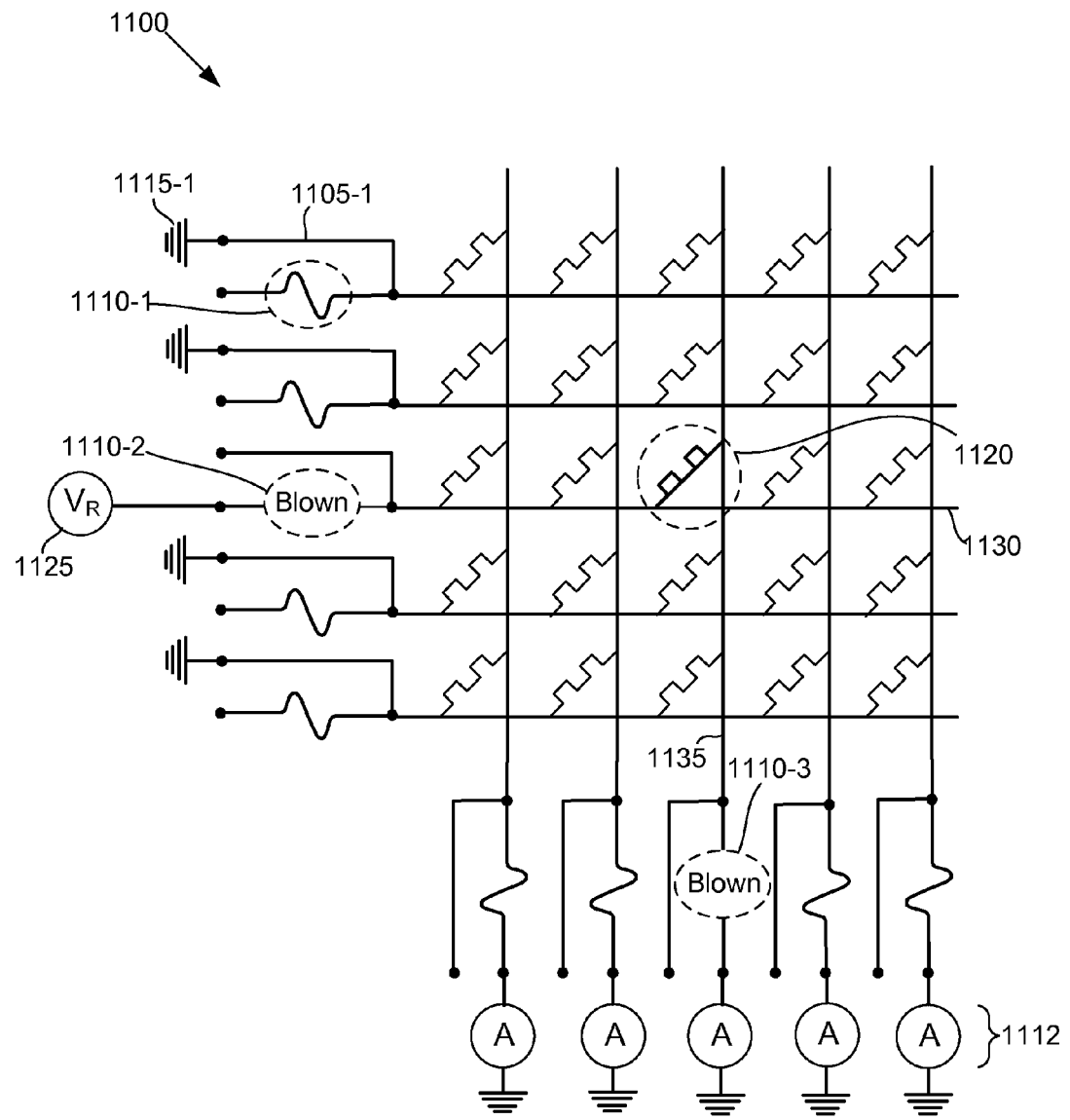
FIG. 11 is a diagram of a programmable crossbar array with blown fuses on the row and column of a shorted memristor with a read voltage applied to the row of the shorted memristor, according to one example of principles described herein.

FIG. 11 shows one example of a programmable crossbar array (1100) that includes additional connection lines (1105-1) that are connected to the row and column lines (1130, 1135) on the array side of the fuses (1110). The support circuitry (1115-1, 1112, 1125), is connected to the external side of the fuses. In FIG. 11, the array is in its read configuration with a read voltage (1125) applied to a row line (1130) with a blown fuse (1110-2) and a shorted memristor (1120). All other row lines are grounded via the additional lines.

The column lines (1135) are configured with current sensors (1112) to read currents that are passed through the various memristors. The fuse (1110-3) in the central column line (1135) is blown, disconnecting the current sensor from the line. The blown fuse (1110-2) in the row line (1130) prevents the read voltage (1125) from being applied and consequently there is no current that passes through the memristors to the current sensors (1112). Thus, in this implementation, the memristors in the row containing the shorted memristor (1120) cannot be read. However, memristors that are in a different row and column than the shorted memristor can be programmed and read as shown below.

Figure 12:
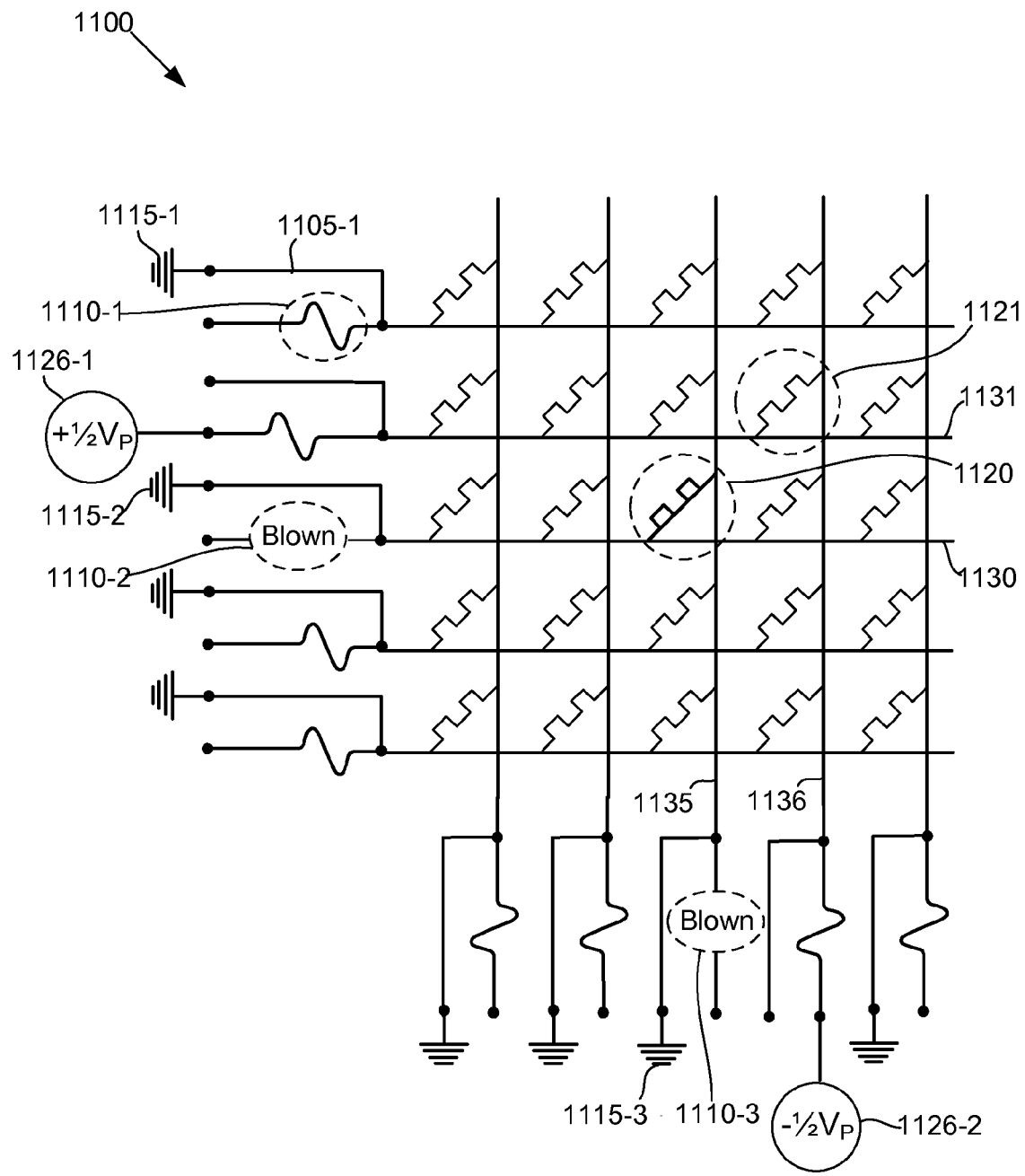
FIG. 12 is a diagram of a programmable crossbar array with programming voltages applied, according to one example of principles described herein.

FIG. 12 shows the programmable crossbar array (1100) in a programming configuration with a programming voltage (1126-1, 1126-2) applied to a target memristor (1121). The programming of memristors in the array could be performed in any of a variety of ways. In this example, half of the programming voltage ($+\frac{1}{2}V_p$) is applied to the row line (1131) connected to the target memristor (1121) and half of the programming voltage ($-\frac{1}{2}V_p$) is applied to the column line (1136) connected to the target memristor (1121). This creates the full programming voltage ($V_p$) across the target memristor (1121) and changes its state. This programming technique is only one example. A variety of other approaches could be used, including applying intermediate voltages to the unselected lines to reduce leakage currents through unselected memristors.

In this example, all of the unselected row and column lines are connected to ground (1115) through the additional connection lines (1105-1), including those row (1130) and column lines (1135) that have blown fuses (1110-2, 1110-3). Because the additional connection lines (505) connect to the row and column lines on the array side of the fuses, they allow column and row lines with blown fuses to be grounded. This prevents these lines from floating to other voltage levels.

Figure 13A:
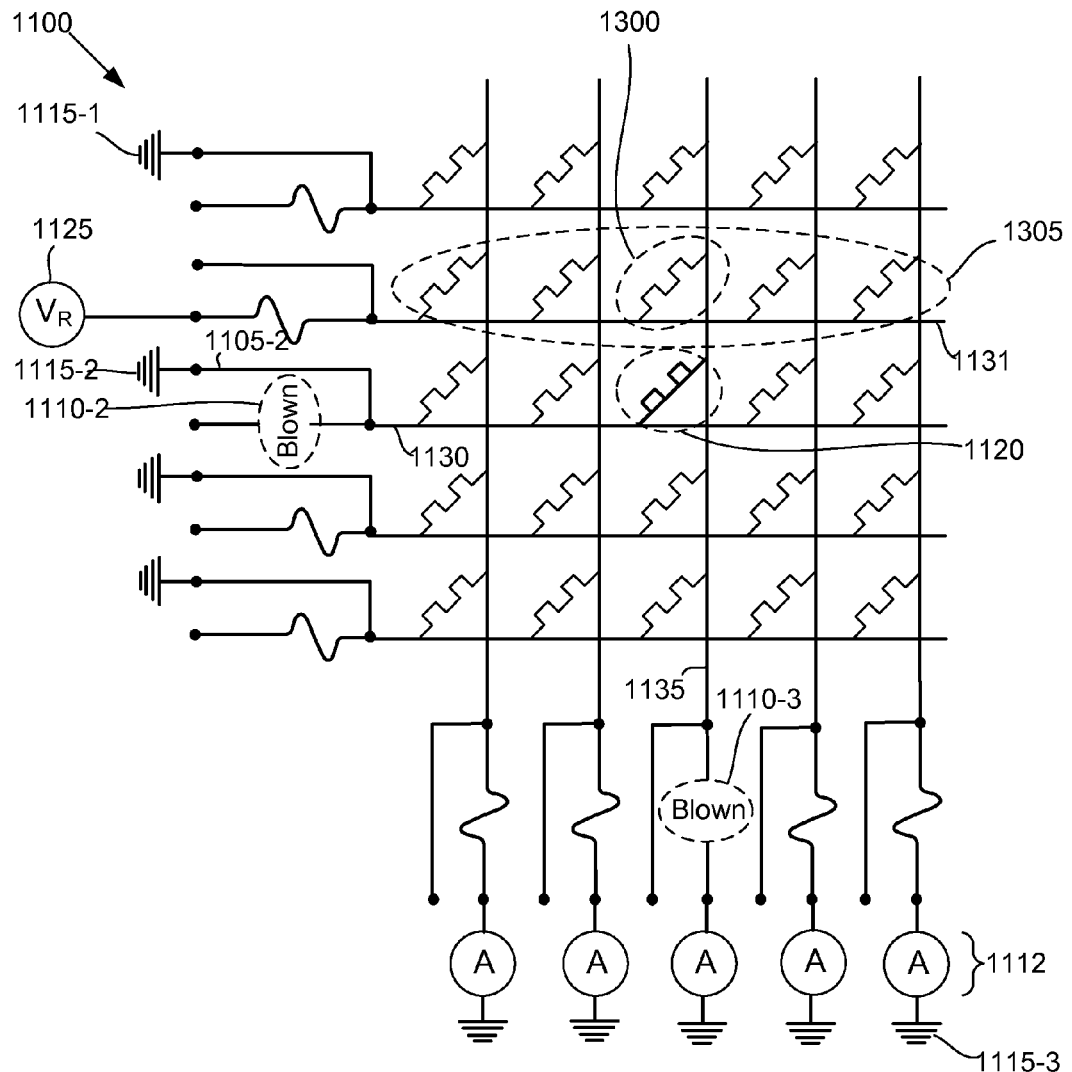
FIG. 13A is a diagram of a programmable crossbar array with a read voltage applied, according to one example of principles described herein.

FIG. 13A shows the programmable crossbar array (1100) in a read configuration where a read voltage (1125) is applied along the second row line (1131) from the top of the array. Current sensors (1112) are connected to all of the column lines. The target memristors (1305) are connected to the selected row and see a read voltage on their row terminal and a ground on their column terminal. The first, second, fourth and fifth memristors are connected to ground (1115) through the current sensors (1112). These current sensors (1112) detect the amount of current passing through the memristors to determine their state. The third memristor (1300) is on the same column (1135) as the shorted memristor (1120). As discussed above, the fuses (1110-2, 1110-3) in the row (1130) and column lines (1135) connected to the shorted memristor (1120) have been blown. However, the row line (1130) connected to the shorted memristor is connected to ground (1115-2) via the additional connection line (1105-2). Current that passes through the third memristor (1300) is shunted to ground (1115-2) through the shorted memristor (1120) in the following way: the current produced by the read voltage passes through the third memristor (1300) down the column line (1135), through the shorted memristor (1120), along the row line (1130 and through additional line (1105-2) to ground (1115-2). The electrical resistance of the third memristor (1300) limits the amount of this current to levels that are within the design range for the array.

If the sensors were connected to the crossbar side of line (1135) there may be some current detected during a read operation. This may lead to ambiguity about whether an element connected to the line has been shorted. However, in this example, the sensors are connected to the external side of the fuses. Because the fuse (1110-3) is blown, there will be no current flowing down line (1135) to the current sensor (1112) during a read operation. Consequently, no current will be detected in that column, indicating that the column is bad (i.e., contains a shorted device). This allows the bits in this column to be marked as erased.

In the example shown in FIG. 13A there is no question that the fuse has been blown and the bits stored in the column should be marked as erased. If no current is detected when reading all memristors in a row, then it can be assumed that the fuse on the row is blown and the row is unreliable because it contains a shorted device. All the data contained in the row can then be marked as erased for ECC decoding purposes. If no current is detected for all memristors in a column then the column has a blown fuse and a shorted device. Consequently, the whole column is deemed unreliable and can be marked as erased.

The configuration shown in FIG. 13A provides for separate lines to connect the ground and voltage sources/current sensors, with the ground connected to the inner terminal of the fuse and the voltage or sensor connected to the outer terminal. This allows for grounding of lines connected to a shorted memristor without affecting currents either induced by the source or sensed by the sensor.

As discussed above, where both the row and column lines have inline fuses, one of the fuses can be configured to blow when a memristor shorts but the other fuse will not blow. In some implementations, the fuses connected to the row lines and the fuses connected to the column lines may not be identical. For example, the fuses connected to the column lines may be designed to blow more quickly and/or at lower energy levels than the fuses connected to the row lines. This ensures that the fuses in the column lines will reliably blow when a memristor shorts during application of a programming voltage. The other fuse may blow at a higher energy or may be a "slow blow" fuse. For example, if the application of read and programming voltages to the array have periods of nanoseconds, the "slow blow" fuse may be configured to blow when voltages are applied over time periods of microseconds.

Figure 13B:
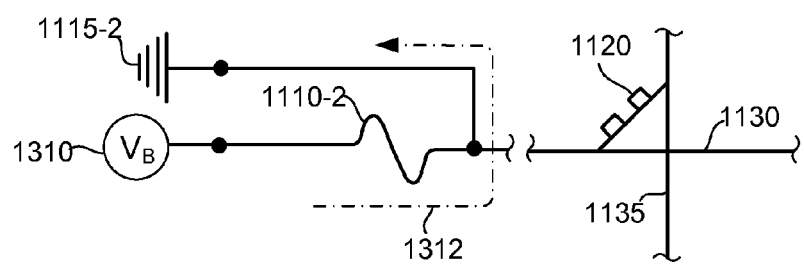
FIG. 13B is a diagram of an applied blow voltage and ground to blow an inline fuse connected to a shorted memristor, according to one example of principles described herein.

A variety of techniques can be used to blow the second fuse after detecting a shorted memristor. FIG. 13B is a diagram of an applied voltage (1310) and ground (1115-2) to blow an inline fuse (1110-2) connected to a shorted memristor (1120). In this example, a blow voltage ($V_B$) is connected to the external terminal of the fuse (1110-2) and a ground (1115-2) is connected to the inside terminal of the fuse. The current (1312) generated by this blow voltage passes from the voltage source, through the fuse (1110-2) and to the ground (1115-2). This blows the fuse (1110-2) to mark the row line (1130) as having a shorted memristor (1120) and prevent damage to the array.

The voltage level and time duration of the blow voltage is configured to blow the fuse (1110-2). For example, the blow voltage may have a voltage level that is lower than the programming voltage or the read voltage, but may have a significantly longer duration. In other examples, the blow voltage may be applied as series of voltage pulses that are specifically designed to blow the fuse (1110-2). In other examples, the blow voltage may have a magnitude that is the same or greater than the programming or reading voltage. For example, the blow voltage may be produced by the same circuit that generates the programming voltage. However, because the voltage is directly passed to ground through the fuse, the voltage on the row line (1130) does not ever reach the read and/or programming voltage levels.

The examples above show crossbar architectures that include fuses inline with all the lines in the array. However, the fuses may be inline with only a portion of the lines. For example, the fuses may be inline with only the row lines or only the column lines. These implementations are simpler than the previous examples. The fuses are designed so that they blow with the current surge caused by the short, with no additional intervention. No special provisions, such as additional lines, are made for grounding.

Figure 14:
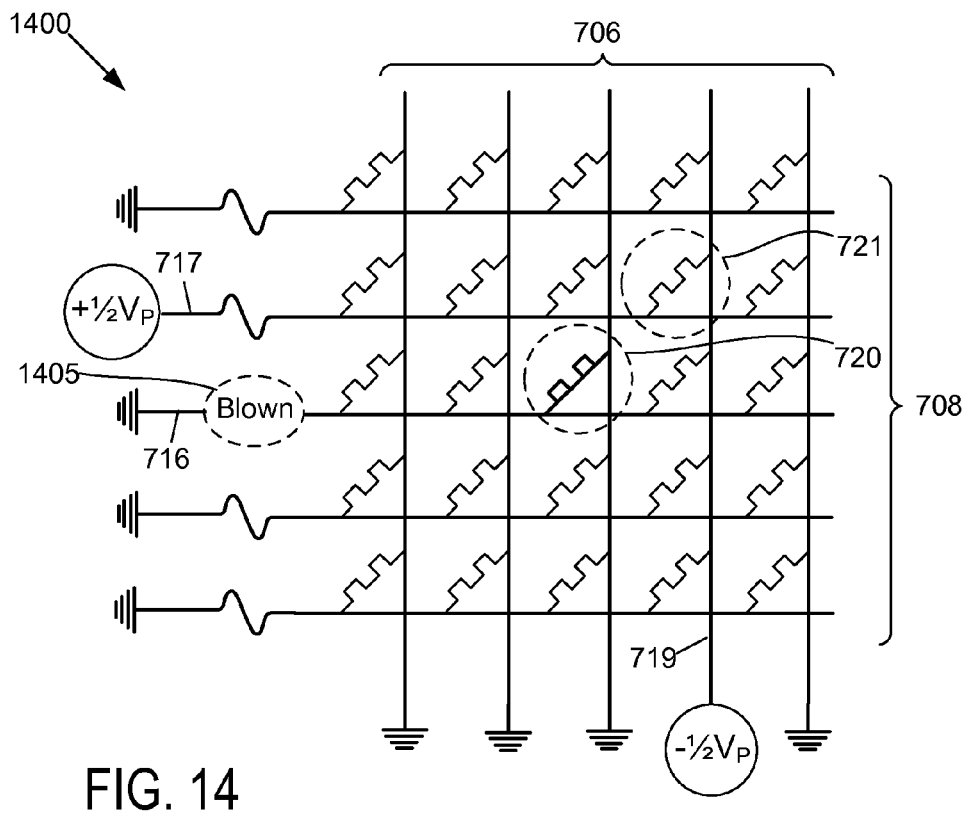
FIG. 14 is a diagram of a programmable crossbar array with inline fuses in the row lines and a programming voltage applied to a selected row line and selected column line, according to one example of principles described herein.
Figure 15:
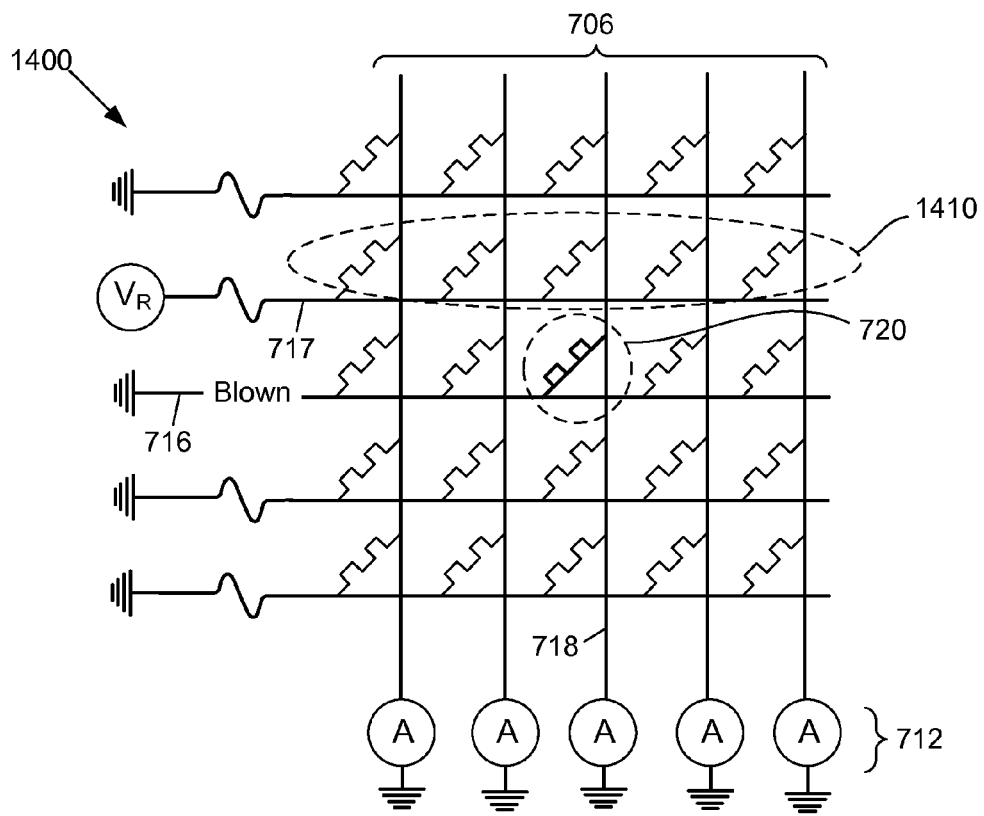
FIG. 15 is a diagram of a programmable crossbar array with inline fuses in the row lines and a read voltage applied to a selected row line and current sensors applied to the column lines, according to one example of principles described herein.

FIGS. 14 and 15 show an example of a programmable crossbar array (1400) that only includes fuses in the row lines (708). The column lines (706) are connected directly to the support circuitry without intervening fuses. FIG. 14 includes a shorted memristor (720) that has blown a fuse in the row line (716) that it is connected to. FIG. 14 also shows a programming voltage ($+\frac{1}{2}V_p$, $-\frac{1}{2}V_p$) that is applied along a row line (717) and column line (719) to change the state of a target memristor (721). The blown fuse (1405) marks the row of the shorted memristor (720) and prevents application of reading and programming voltages to that row (716). This configuration preserves the avoidance of excessive currents when attempting to write to a shorted location and also the ability to identify shorted rows. However, it does not preserve the ability to identify shorted columns ("erased" columns). Reading from the devices on the same column as the shorted memristor may be unreliable and may have to be handled as "full errors" rather than "erasures" by the ECC system. The system offers a trade-off: a simpler architecture and fuse system at the price of a more powerful ECC.

FIG. 15 shows the array (1400) in a read configuration, with the read voltage ($V_R$) connected to a row line (717) so that state of all the memristors (1410) connected to that row line can be read by current sensors (712) connected to the column lines (706). In this example, the shorted memristor (720) does not shunt the current passing along the column (718) to ground and the state memristor connected to this column can potentially be read. However, because the example of FIGS. 14 and 15 does not include fuses in both the row lines and the column lines, the exact location of the shorted memristor is not marked by blown fuses. To recover data that was stored in the shorted memristor or in memristors in the same row and column as the shorted memristor, a more robust ECC code may be used.

Figure 16:
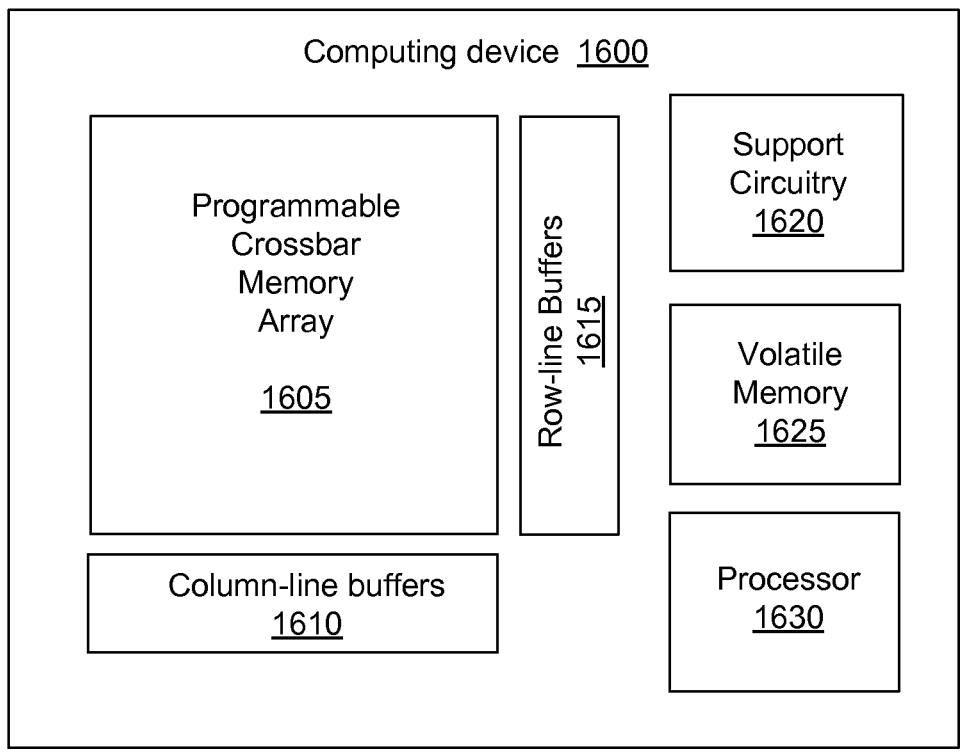
FIG. 16 is a block diagram of a computing system that includes a programmable crossbar array with inline fuses, according to one example of principles described herein.

FIG. 16 is a diagram of a computing device (1600) that includes a programmable crossbar array (1605) with inline fuses. The crossbars in the crossbar array (1605) are connected to column line buffers (1610) and row line buffers (1615). The column line buffers (1610) and row line buffers (1615) are selectively activated to connect support circuitry (1620) to the column lines and row lines in the programmable crossbar array (1605). Thus, the buffers can be viewed as switches that selectively connect and disconnect the various components within the support circuitry to selected lines. The support circuitry (1620) may include voltage supplies, a ground and current sensors. The support circuitry may also include a variety of other circuits including sense circuitry, threshold modules, sample and hold circuits and other circuits that support the function of the crossbar array (1605). The processor (1630) and volatile memory (1625) may read and write data to the nonvolatile memristors in the programmable crossbar array (1605).

In some examples, the support circuitry (1620) may automatically detect shorted memristors and take the appropriate mitigating action. For example, the support circuitry may identify a shorted memristor and blow a fuse in a line connected to the shorted memristor. In other examples, the support circuitry may work cooperatively with the processor (1630) and volatile memory (1625) to detect potential shorted memristors within the crossbar array (1405) and take appropriate corrective action. For example, the processor and volatile memory may be programmed to recover data that was stored or intended to be stored on the shorted memristor or on memristors in the same row and column as the shorted memristor.

The description above describes a number of examples of programmable crossbar arrays with inline fuses that include a layer of row lines and a layer of column lines with the row conductors crossing over the column conductors to form junctions and memristors sandwiched between row lines and column lines at the junctions. Inline fuses are placed either in the row lines, column lines or both. The inline fuses are interposed between the support circuitry and the memristors. In some implementations, additional lines may be connected to row and column lines on an array side of the fuses. These additional lines provide grounding paths to prevent lines that are disconnected by blown fuses from undesirably floating at intermediate voltages.

The inline fuses connected to the lines are configured to blow when a memristor connected to the line shorts. In some examples, the inline fuses may automatically blow. In other examples some of the inline fuses may blow automatically while others are blown by a separate application of a voltage. The blown fuses may serve as flags marking shorted memristors for an error correction code decoder to recover data and prevent application of programming and reading voltages to lines connected to the shorted memristors. Buffers may be used to connect/switch various elements in the support circuitry to the lines in the crossbar array. The support circuitry may include voltage sources, current sensors, a ground, and other components.

Figure 17:
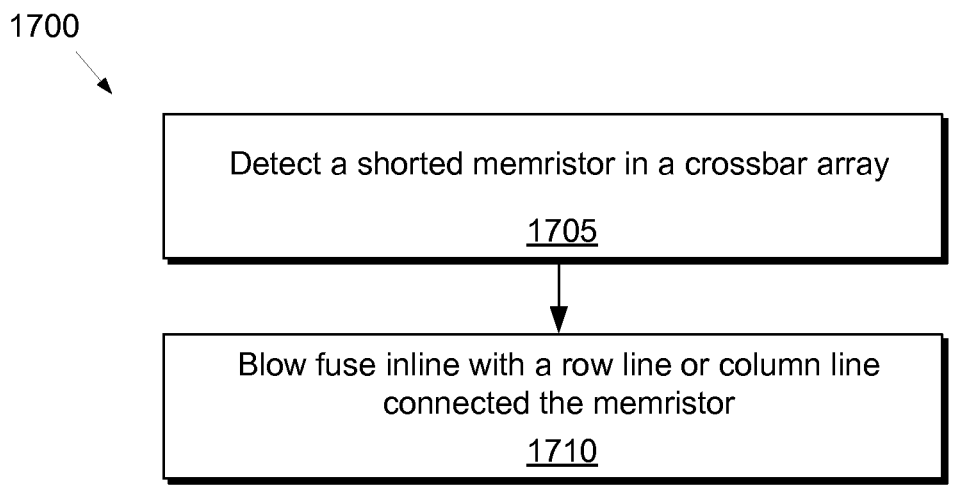
FIG. 17 is a flowchart of a method for using a programmable crossbar array with inline fuses, according to one example of principles described herein.

FIG. 17 is a flowchart (1700) which describes a method for using fuses to mitigate shorted memristors in a programmable crossbar array. As discussed above, the shorted elements have a resistance that is significantly less than the lowest operating resistance. For multilevel cells, a shorted element has a lower resistance than the lowest designed resistance of the multilevel cell or a higher current than the maximum expected current.

The method includes detecting a shorted memristor within the array (1705). The shorted memristor may be detected in a number of ways. The occurrence of a short will likely be detected when an attempt to write into a memristor results in current exceeding some pre-established threshold. The shorting of a memristor could automatically result in the blowing of a fuse connected to the row or column line connected to the shorted element. The blowing of the fuse could also be detected by a lack of current flowing through the circuit.

In other examples, the shorting of the memristor may exhibit a unique electrical signature that could be detected. Other techniques include measuring the electrical resistance of the shorted memristor and determining that it is lower than the lowest design resistance of the memristors in the array. For example, when applying a reading voltage to the shorted memristor(s), an abnormally high current may flow through the shorted memristor(s).

Other examples including attempting to switch the shorted memristor and determining that the shorted memristor did not respond. For example, a first programming voltage could be applied to switch the memristor from a low resistance ON state to a high resistance OFF state. However, because the memristor is shorted, it will not respond to this or any other programming voltage. After applying the programming voltage, it can be determined that the memristor did not switch to the high resistance OFF state, thus indicating that the memristor may be shorted.

The fuse (or fuses) inline with a row and/or column line connected to the shorted memristor are then blown (1710). For example, at least one of the shorted elements may blow as a result of the current flowing through the line. In some implementations, a second fuse may be blown through a separate process. As discussed above with respect to FIG. 13B, a current sufficient to blow the second fuse can be applied by grounding one side of the fuse and applying a voltage at the second end of the fuse. This blows the fuse in a controlled manner that does not require current to pass through the shorted memristor or any other memristor in the array.

Data stored on the shorted memristor (and memristors that are affected by shorted memristor) may be recovered. The data that was stored, or was intended to be stored, on the shorted memristor can be recovered in a variety of ways. For example, if it is desirable for the data written on the memristor to be recovered, an error correction code can be used. An error correction code is derived from a block of data and is designed to allow a limited number of errors to be corrected. An error correction code can compensate for errors caused by write issues, noise, storage faults, failure of memristors, and other types of errors. As discussed above, in examples where the fuses mark the location of the shorted memristors, the overhead for implementing the error correction code may be significantly smaller.

In other situations, the data to be written to the crossbar array may be most important. This data can be preserved by maintaining the data in a separate memory until it is confirmed that the write to the crossbar array is successful and complete. When failure occurs, the data can simply be rewritten to a different location in the crossbar array.

In some situations, the memristors may disproportionately fail during a write operation because the write operation uses higher voltages than a read operation. Further, the memristors may disproportionately fail during write operations that transition from a high resistance state to a low resistance state. This may occur for a variety of reasons, including the generation of a current spike that occurs as the memristor's electrical resistance rapidly drops during the switching process. Because the typical failure characteristics of the memristors can be characterized in advance, the data bit that was intended to be stored on the shorted memristor can be assumed. For example, if the memristors tend to fail during a write operation from a high resistance OFF state to a low resistance ON state, it can be assumed with a predetermined level of confidence that the shorted memristor should be read as being in the ON state or a digital 1. In some implementations, memristors that are connected to the same row and column as a shorted memristor may not be readable or programmable. However, in other implementations, such as those shown in FIGS. 14 and 15, at least a portion of the memristors may be readable.

In future write operations, the failure of the shorted memristor can be compensated for when writing the data to the crossbar array by skipping the row and column connected to the shorted memristor. Where inline fuses connected to the row and column connected to the shorted memristor are blown, the system cannot write to the row and column because they are electrically disconnected. This effectively flags the location of the shorted memristors and allows the system to automatically compensate.

In conclusion, the principles described above provide for graceful degradation of the programmable crossbar array. One or more inline fuses are blown when a memristor shorts. If an attempt is made to write to the shorted memristor, voltages will be applied to open conductors, so no current will flow. This prevents excessive currents that may damage the array, support circuits, and produce other undesirable effects. When attempting to read from any location in the affected row or column, again no current will flow. This situation is easily and reliably detected so that the affected row and column can be marked as "erased" which is a computationally easier problem for ECC data recovery.

When coupled with an appropriate ECC scheme, the principles above make the handling of shorted locations "transparent" to the system, in the sense that the addressing mechanisms are identical whether the row or column addressed contain defective devices or not. All the knowledge about the defects is contained, overall, in the array of fuses, which act, in a sense, as "flags" marking defective locations. When reading the array, these locations will produce distinctive readings which can be interpreted by the ECC system to handle the errors efficiently. In a sense, the array of fuses acts as the "defect list" mentioned earlier, except that the fuse "list" is distributed and local, and does not require any handling or processing, except at the instant a short occurs, when the appropriate fuses are blown.

By mitigating the shorting of a memristor, the function and a substantial portion of the capacity of the programmable crossbar array are preserved. The use of inline fuses can reduce power consumption, allow for transparent operation, allow for more efficient recovery of data lost due to memristor failure, protect the array and support circuitry from current surges, and provide other benefits. Although examples above refer to "memristors," any a wide range of nonvoltaile resistive memory elements could be substituted for the memristors in the crossbar array.

Various other adaptations and combinations of features of the examples disclosed are within the scope of the invention.

What is claimed is:

1. A method to manage access to a memory array, comprising:
   encoding a bit string with a rank metric code encoder to generate a rank metric codeword comprising an encoded binary array, wherein the rank metric codeword is an error-correcting codeword;
   modifying the encoded binary array so each row of the encoded binary array has at most half of the row with a first bit value and each column of the encoded binary array has at most half of the column with the first bit value; and storing the modified binary array into corresponding memory devices of the memory array.

2. The method of claim 1, wherein:

the rank metric code encoder has a minimum rank distance of $\delta>2$ and a redundancy $\rho=(\delta-1)n$ for a n by n encoded binary array or a redundancy $\rho=(\delta-1)\max(n,m)$ for a m by n encoded binary array; and the bit string has a length of $n2-\rho$ for the n by n encoded binary array or $nm-\rho$ for the m by n encoded binary array.

3. The method of claim 1, wherein modifying the encoded binary array comprises iteratively bit-flipping each row that has more than half of the row with the first bit value and each column that has more than half of the column with the first bit value until no such row and no such column remain.

4. The method of claim 3, wherein iteratively bit-flipping comprises:

(1) bit-flipping each row having more than half of the row with a bit value 1;

(2) after (1), bit-flipping each column having more than half the column with the bit value 1; and (3) after (2), when at least one row has more than half of the row with the bit value 1 or one column has more than half of the column with the bit value 1, returning to (1):

5. The method of claim 1, further comprising:

reading the memory array to retrieve a corrupted binary array comprising a corrupted rank metric codeword; and decoding the corrupted rank metric codeword with a rank metric code decoder to recover the bit string.

6. The method of claim 5, wherein:

the corrupted binary array includes a s number of crisscross erasures corresponding to corrupted rows and columns having known locations in the memory array; and the method includes filling the s number of crisscross erasures in the corrupted binary array with a same bit value before decoding the corrupted rank metric codeword.

7. The method of claim 6, wherein the corrupted binary array includes a t number of crisscross errors corresponding to corrupted rows and columns having unknown locations in the memory array.

8. The method of claim 7, wherein:

the rank metric code encoder has a minimum rank distance of $\delta>2$ and a redundancy $\rho=(\rho-1)n$ for a n by n encoded binary array or a redundancy $\rho=(\delta-1)\max(n,m)$ for a m by n encoded binary array;

the bit string has a length of $n2-\rho$ for the n by n encoded binary array or $nm-\rho$ for the m by n encoded binary array; and $2+2s+4t<\delta$.

9. The method of claim 1, wherein the memory devices are resistive switching devices that are to be switched into one of an ON state of low resistance and an OFF state of high resistance.

10. An apparatus, comprising:

a memory array comprising memory devices arranged in a crossbar;

a memory controller to write to and read from memory devices in the memory array, the memory controller comprising a rank metric code encoder and a rank metric code decoder, wherein the memory controller is to:

encode a bit string with the rank metric encoder to generate a rank metric codeword comprising an encoded binary array, wherein the rank metric codeword is an error-correcting codeword;

modify the encoded binary array so each row of the encoded binary array has at most half of the row with a bit value and each column of the encoded binary array has at most half of the column with the bit value; and store the modified binary array into corresponding memory devices of the memory array.

11. The apparatus of claim 10, wherein to modify the encoded binary array, the memory controller is to iteratively bit-flip each row of the encoded binary array that has more than half of the row with the bit value and each column of the encoded binary array that has more than half of the column with the bit value until no such row and no such column remain.

12. The apparatus of claim 11, wherein to iteratively bit-flip, the memory controller is to:

(1) bit-flip each row having more than half of the row with a bit value 1;

(2) after (1), bit-flip each column having more than half the column with the bit value 1; and (3) after (2), when at least one row has more than half of the row with the bit value 1 or one column has more than half of the column with the bit value 1, return to (1).

13. The apparatus of claim 10, wherein the memory controller is further to:

read the memory array to retrieve a corrupted binary array comprising a corrupted rank metric codeword; and decode the corrupted rank metric codeword with the rank metric code decoder to recover the bit string.

14. The apparatus of claim 13, wherein:

the corrupted binary array includes a s number of crisscross erasures corresponding to corrupted rows and columns having known locations in the memory array; and the memory controller is to fill the s number of crisscross erasures in the corrupted binary array with a same bit value before decoding the corrupted rank metric codeword.

15. The apparatus of claim 14, wherein the corrupted binary array includes a t number of crisscross errors corresponding to corrupted rows and columns having unknown locations in the memory array.

16. The apparatus of claim 15, wherein:

the rank metric code encoder has a minimum rank distance of $\delta>2$ and a redundancy $\rho=(\delta-1)n$ for a n by n encoded binary array or a redundancy $\rho=(\delta-1)\max(n,m)$ for a m by n encoded binary array; and the bit string has a length of $n2-\rho$ for the n by n encoded binary array or $nm-\rho$ for the m by n encoded binary array.

17. The apparatus of claim 10, wherein the memory devices are resistive switching devices that are to be switched between an ON state of low resistance and an OFF state of high resistance.

18. A non-transitory computer readable medium on which is stored machine readable instructions that when executed are to cause a processor to:

encode a bit string with a rank metric code encoder to generate a rank metric codeword comprising an encoded binary array, wherein the rank metric codeword is an error-correcting codeword;

modifying the encoded binary array so each row of the encoded binary array has at most half of the row with a bit value and each column of the encoded binary array has at most half of the column with the bit value; and storing the modified binary array into corresponding memory devices of the memory array.

19. The non-transitory computer readable medium of claim 18, wherein the machine readable instructions are further to cause the processor to:
read the memory array to retrieve a corrupted binary array comprising a corrupted rank metric codeword; and
decode the corrupted rank metric codeword with a rank metric code decoder to recover the bit string.

20. The non-transitory computer readable medium of claim 18, wherein:
the rank metric code encoder has a minimum rank distance of $\delta>2$ and a redundancy $\rho=(\delta-1)n$ for a n by n encoded binary array or a redundancy $\rho=(\delta-1)\max(n,m)$ for a m by n encoded binary array; and
the bit string has a length of $n2-\rho$ for the n by n encoded binary array or $nm-\rho$ for the m by n encoded binary array.

* * * * *